US012759010B2

(12) United States Patent
Kim et al.

(10) Patent No.: US 12,759,010 B2
(45) **Date of Patent: *Oct. 13, 2026**

(54) LIQUID PROCESSING APPARATUS

(71) Applicant: Tokyo Electron Limited, Tokyo (JP)

(72) Inventors: Junghyun Kim, Hwaseong-si (KR); Koshi Muta, Koshi City (JP); Daiki Takahashi, Koshi City (JP); Kohei Kawakami, Koshi City (JP); Satoshi Shimmura, Koshi City (JP); Kenta Shibasaki, Koshi City (JP); Shota Ueyama, Koshi City (JP); Tetsushi Miyamoto, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 543 days.

This patent is subject to a terminal disclaimer.

(21) Appl. No.: 18/346,293

(22) Filed: Jul. 3, 2023

(65) Prior Publication Data

US 2024/0009697 A1 Jan. 11, 2024

(30) Foreign Application Priority Data

Jul. 5, 2022 (JP) ................................ 2022-108485

(51) Int. Cl.
*B05C 11/08* (2006.01)
*H10P 72/00* (2026.01)

(52) U.S. Cl.
CPC .......... *B05C 11/08* (2013.01); *H10P 72/0448* (2026.01)

(58) Field of Classification Search
CPC . B05C 11/08; G03F 7/16; G03F 7/161; G03F 7/162; G03F 7/164; G03F 7/165; G03F 7/167; G03F 7/168; G03F 7/18
See application file for complete search history.

(56) References Cited

U.S. PATENT DOCUMENTS

| | | | | |
|---|---|---|---|---|
| 2019/0067043 A1* | 2/2019 | Uemura | ............ | H01L 21/67023 |
| 2019/0255561 A1* | 8/2019 | Shimmura | ................ | B05C 5/02 |
| 2024/0012329 A1* | 1/2024 | Kim | ........................ | G03F 7/162 |

FOREIGN PATENT DOCUMENTS

| | | |
|---|---|---|
| JP | 2019-145561 A | 8/2019 |

* cited by examiner

*Primary Examiner* — James M Mellott
(74) *Attorney, Agent, or Firm* — Armstrong Teasdale LLP

(57) ABSTRACT

A liquid processing apparatus that applies a coating liquid onto a substrate, includes: a substrate holder that holds and rotates the substrate; a coating liquid supplier that supplies the coating liquid to the substrate; a cup provided to surround the substrate; and a solvent supplier that supplies a solvent for the coating liquid to a coating liquid collector. The cup includes: an outer cup arranged outside the substrate holder; an inner cup arranged on an inner peripheral side of the outer cup below the substrate holder and having a downwardly-extending wall; an exhaust path provided between the outer and inner cups; and the coating liquid collector provided with a plurality of openings through which an exhaust flow passes, the coating liquid collector extending downward below the downwardly-extending wall of the inner cup with a gap between the coating liquid collector and a lower end of the downwardly-extending wall.

12 Claims, 9 Drawing Sheets

LIQUID PROCESSING APPARATUS

CROSS-REFERENCE TO RELATED APPLICATION

This application is based upon and claims the benefit of priority from Japanese Patent Application No. 2022-108485, filed on Jul. 5, 2022, the entire contents of which are incorporated herein by reference.

TECHNICAL FIELD

The present disclosure relates to a liquid processing apparatus.

BACKGROUND

Patent Document 1 discloses a liquid processing apparatus that applies a coating liquid onto a substrate. This liquid processing apparatus includes: a substrate holder that holds and rotates the substrate; a coating liquid supplier that applies the coating liquid to the substrate held by the substrate holder; a cup arranged outside the substrate holder so as to surround the substrate held by the substrate holder; an exhaust path provided between the substrate holder and an inner peripheral surface of the cup; a coating liquid collector provided above the exhaust path so as to cover the exhaust path and including a vertically-communicating opening; a solvent supplier that supplies a solvent for the coating liquid to the coating liquid collector; and a relay located above the coating liquid collector and protruding from the inner peripheral surface of the cup toward the coating liquid collector.

PRIOR ART DOCUMENTS

Patent Documents

Patent Document 1: Japanese Patent Laid-Open Publication No. 2019-145561

SUMMARY

According to one embodiment of the present disclosure, a liquid processing apparatus that applies a coating liquid onto a substrate, includes: a substrate holder configured to hold and rotate the substrate; a coating liquid supplier configured to supply the coating liquid to the substrate held by the substrate holder; a cup provided to surround the substrate held by the substrate holder; and a solvent supplier configured to supply a solvent for the coating liquid to a coating liquid collector, wherein the cup includes: an outer cup arranged outside the substrate holder; an inner cup arranged on an inner peripheral side of the outer cup below the substrate holder and having a downwardly-extending wall; an exhaust path provided between the outer cup and the inner cup; and the coating liquid collector provided with a plurality of openings through which an exhaust flow passes, the coating liquid collector extending downward below the downwardly-extending wall of the inner cup with a gap between the coating liquid collector and a lower end of the downwardly-extending wall.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Figure 1:
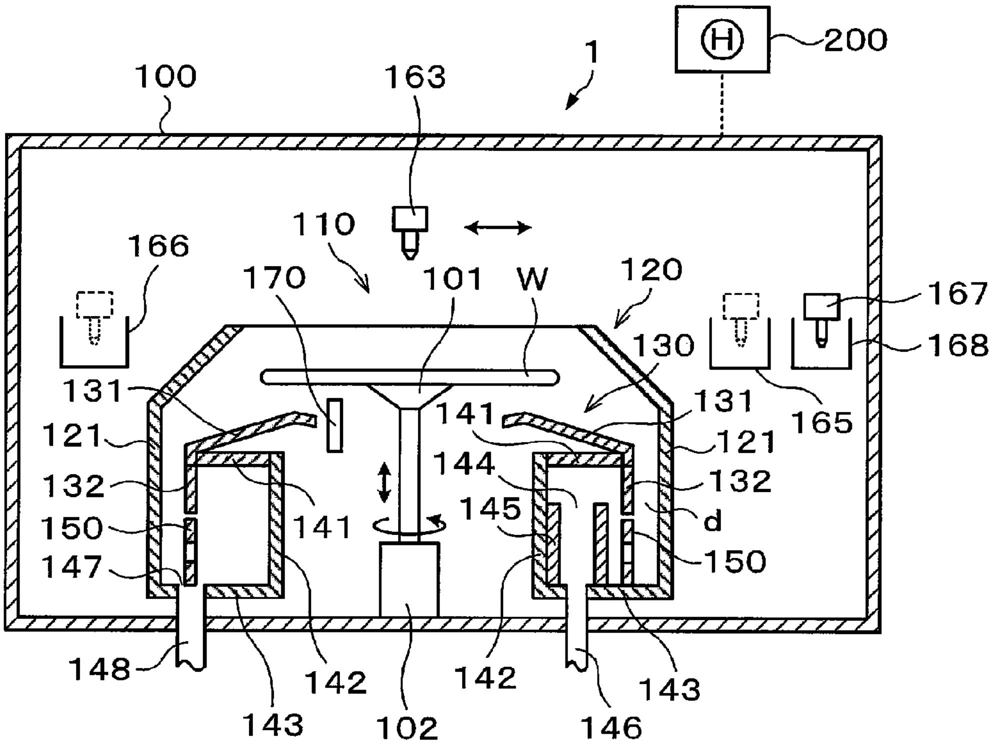
FIG. 1 is a longitudinal cross-sectional view schematically illustrating a configuration of a resist coating apparatus according to the present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

For example, in a photolithography of a manufacturing process of semiconductor devices, a coating process in which a predetermined coating liquid is applied onto a semiconductor wafer (hereinafter referred to as a "wafer") as a substrate to form a coating film such as an antireflection film or a resist film is performed.

In the coating process described above, a so-called spin coating method is widely used, in which a coating film is formed on a wafer by supplying a coating liquid from a nozzle to the wafer under rotation and spreading the coating liquid over the wafer by virtue of a centrifugal force. A rotary liquid processing apparatus for performing the spin coating method is provided with a container, called a cup, in order to prevent the coating liquid scattered from a surface of the rotating wafer from scattering to the surroundings. In the cup, evacuation is performed from the bottom thereof so as to prevent the outside of the cup from being contaminated by the flying of the coating liquid in the form of mist, which is scattered from the edge of the rotating wafer.

However, in recent years, there is a case where a coating film having a large film thickness needs to be formed on a wafer using a coating liquid such as a high-viscosity resist liquid. In the case of using such a high-viscosity coating liquid, the coating liquid may be dropped from the edge of the wafer and be partially solidified in a filamentous form when the wafer coated with the coating liquid is rotated to spread the coating liquid. Further, a plurality of coating liquids solidified in a filamentous form (hereinafter referred to as filamentous foreign substances) may be generated in the course of performing the coating process. These filamentous foreign substances may be entangled with each other to form flocculent foreign substances.

There is a concern that these filamentous or flocculent foreign substances may clog an exhaust path. In particular, since the exhaust path in the vicinity of the inner bottom of the cup has many narrower portions than the exhaust path at the upper portion of the cup, it is easy to be clogged with the foreign substances. When the exhaust path is clogged with the foreign substances, a desired exhaust pressure required for exhausting the interior of the cup may not be obtained. Thus, for example, the mist-like coating liquid may fly upward of the cup, which contaminates the outside of the cup.

Therefore, a technique according to the present disclosure prevents an exhaust path from being clogged due to foreign substances generated when performing a spin coating process on a substrate.

Hereinafter, a liquid processing apparatus according to the present embodiment will be described with reference to the drawings. In addition, in this specification and the accompanying drawings, elements having substantially the same functional configuration will be denoted by the same reference numerals, and redundant explanations thereof will be omitted.

Figure 2:
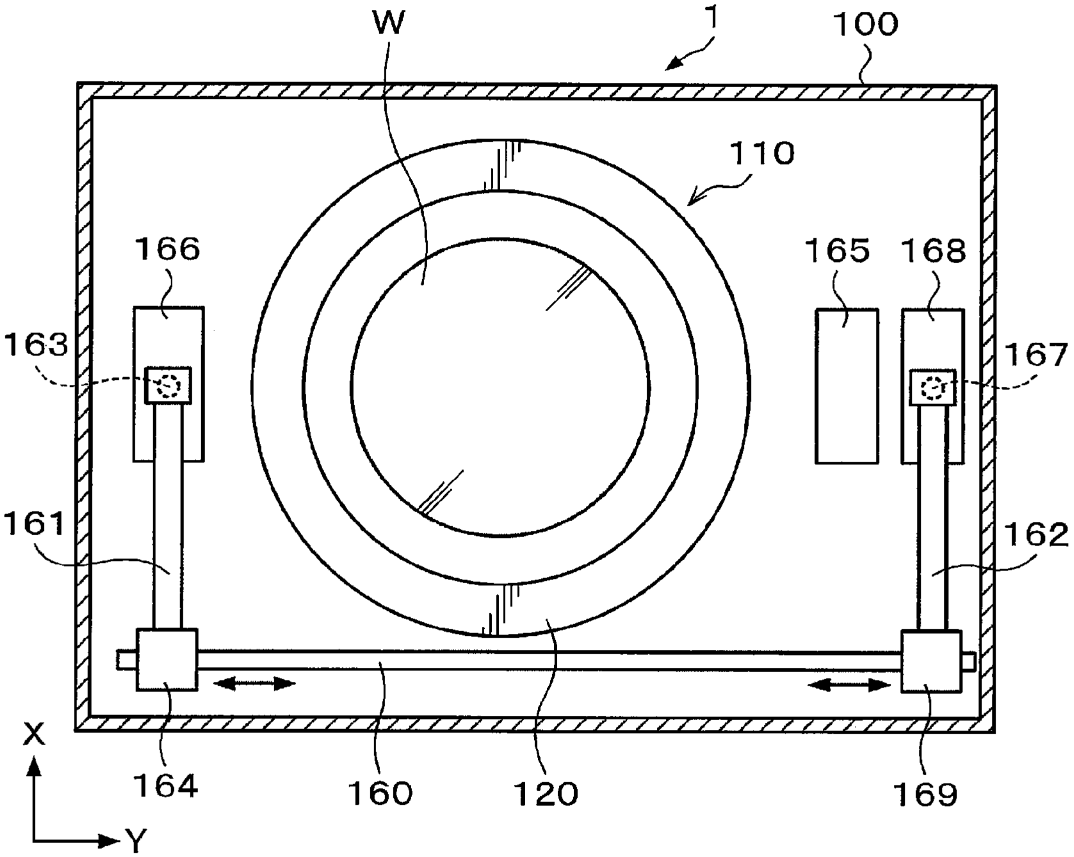
FIG. 2 is a transversal cross-sectional view schematically illustrating the configuration of the resist coating apparatus according to the present embodiment.
Figure 3:
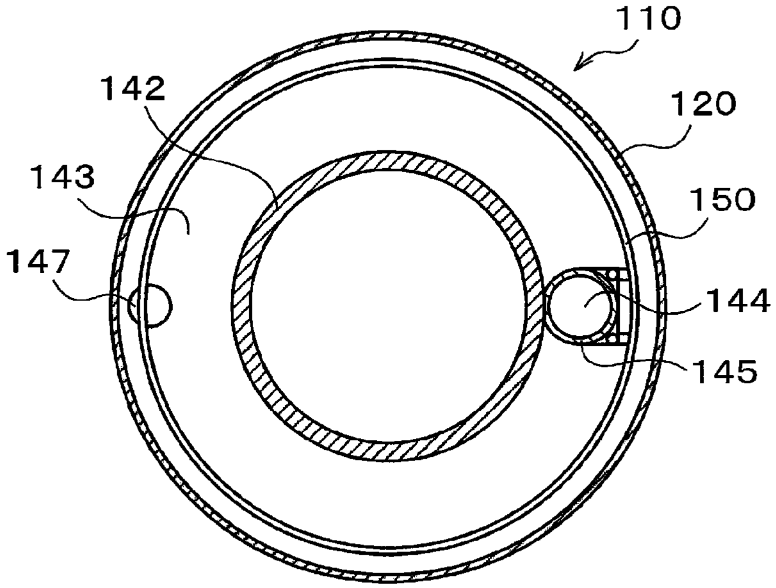
FIG. 3 is a cross-sectional view of a cup for explaining a mesh ring.
Figure 4:
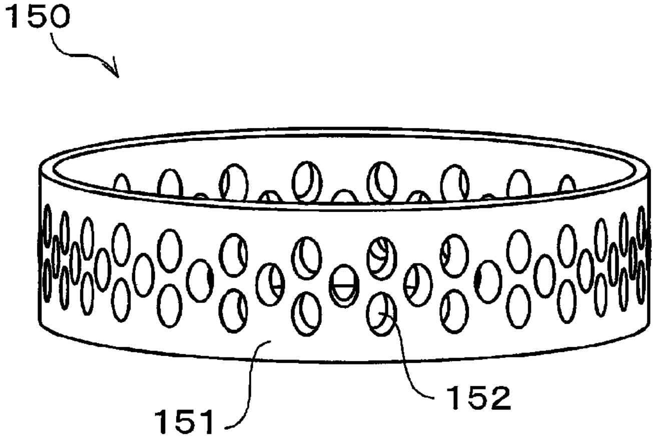
FIG. 4 is a perspective view of the mesh ring.

FIGS. 1 and 2 are a longitudinal cross-sectional view and a transversal cross-sectional view schematically illustrating a configuration of a resist coating apparatus 1 as the liquid processing apparatus, respectively. FIG. 3 is a transversal cross-sectional view of a cup 110 for explaining a mesh ring 150 as a coating liquid collector. FIG. 4 is a perspective view of the mesh ring 150.

As illustrated in FIGS. 1 and 2, the resist coating apparatus 1 includes a processing container 100 having a hermetically-sealable interior. A loading/unloading port (not illustrated) for a wafer W as a substrate is formed in a side surface of the processing container 100. A spin chuck 101 as a substrate holder that holds and rotates the wafer W is provided within the processing container 100. The spin chuck 101 may be rotated at a predetermined speed by a chuck driver 102 such as a motor. Further, the chuck driver 102 is provided with a lifting drive mechanism such as a cylinder, so that the spin chuck 101 may be moved up and down.

Further, the cup 110, which accommodates the spin chuck 101 and is exhausted from the bottom thereof, is provided within the processing container 100. The cup 110 receives and collects a liquid scattered or dropping from the wafer W. The cup 110 includes an outer cup 120 as an outer cup arranged outside the spin chuck 101 so as to surround the wafer W held by the spin chuck 101, and an inner cup 130 as an inner cup located on an inner peripheral side of the outer cup 120.

A sidewall 121 as a downwardly-extending cylindrical wall is provided at a lower portion of the outer cup 120. Further, the inner cup 130 includes an annular inclined wall 131 which is inclined down from an inner peripheral end toward an outer peripheral end thereof, and a sidewall 132 as a cylindrical wall extending down from the outer peripheral end of the inclined wall 131. The inclined wall 131 is arranged below the spin chuck 101 and receives the liquid dropping from the wafer W. The sidewall 132 is arranged so as to face an inner peripheral surface of the sidewall 121 of the outer cup 120. A gap is formed between the sidewall 121 and the sidewall 132 to constitute an exhaust path d.

A circular ring-shaped horizontal member 141, a cylindrical vertical member 142, and a circular ring-shaped bottom member 143 located at the bottom of the cup 110 are provided below the inner cup 130. A space surrounded by these members 141, 142 and 143, and the sidewall 132 of the inner cup 130 described above is defined within the cup 110. A cylindrical wall portion 145 having an exhaust port 144 that is in communication with the exhaust path d is provided within the space. The cylindrical wall portion 145 is arranged such that the exhaust port 144 faces the vertical direction (height direction), and an exhaust pipe 146 is connected to the bottom member 143 at a lower end of the cylindrical wall portion 145. That is, an exhaust flow in the cup 110 passes through the cylindrical wall portion 145 and is discharged from the exhaust path d.

A liquid discharge port 147 for discharging the collected liquid therethrough is formed in the bottom member 143 between the sidewall 121 of the outer cup 120 and the vertical member 142. A liquid discharge pipe 148 is connected to the liquid discharge port 147.

The mesh ring 150 as a coating liquid collector is provided below the sidewall 132 of the inner cup 130. The mesh ring 150 collects a resist liquid between the sidewall 132 of the inner cup 130 and the bottom member 143. A material of the mesh ring 150 is, for example, a metal such as stainless steel, but is not particularly limited as long as it has chemical resistance to solvents.

The mesh ring 150 is fixed to the cup 110 in a state where there is a gap between an upper end of the mesh ring 150 and a lower end of the sidewall 132 of the inner cup 130. The upper limit of the size of the gap may be arbitrarily set within a range that does not impair the function of the mesh ring 150 as the coating liquid collector. For example, the upper limit may be set to 10 mm or less. A method of fixing the mesh ring 150 to the cup 110 is not particularly limited, but a desirable fixing method will be described later.

Further, a position of an outer peripheral surface of the sidewall 132 and a position of an outer peripheral surface of the mesh ring 150 in the radial direction of the cup 110 are substantially the same. A relationship of these positions may be changed as appropriate according to the shape of the inner cup 130 and the like such that a solvent flowing down along an outer peripheral surface of the inner cup 130 drops on the mesh ring 150.

As illustrated in FIGS. 3 and 4, the mesh ring 150 is a cylindrical component that is open at upper and lower surface portions thereof. As illustrated in FIG. 4, a sidewall 151 of the mesh ring 150 is provided with a plurality of openings 152 through which the exhaust flow passes. These openings 152 are through-holes penetrating from an outer peripheral surface to an inner peripheral surface of the sidewall 151. Further, these openings 152 are formed at intervals along the circumferential direction of the sidewall 151. In the example illustrated in FIGS. 3 and 4, the respective openings 152 are arranged in a zigzag pattern.

Figure 5:
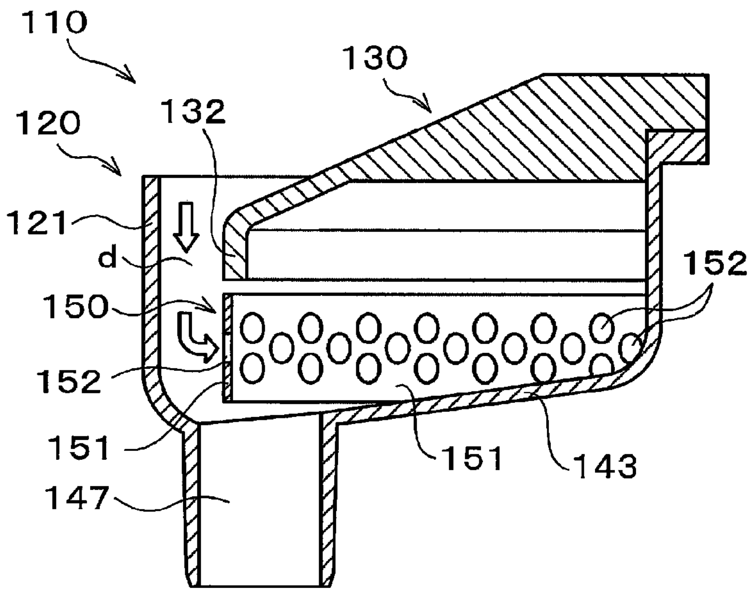
FIG. 5 is a longitudinal cross-sectional view of the cup for explaining the mesh ring.

FIG. 5 is a longitudinal cross-sectional view of the cup for explaining the mesh ring 150, where white arrows indicate the direction of the exhaust flow. As illustrated in FIG. 5, the exhaust flow flowing in the exhaust path d passes through the openings 152 of the mesh ring 150 and is directed to the exhaust port 144 (FIG. 1). On the other hand, the resist liquid flowing down along the outer peripheral surface of the inner cup 130 or the resist liquid solidified in a filamentous form during a resist coating process does not easily pass through the openings 152 of the mesh ring 150 and stays on the sidewall 151. Thus, the resist liquid, which may become flocculent foreign substances, is collected in the mesh ring 150.

In addition, although the shape of the mesh ring 150 is cylindrical in the present embodiment, the shape of the mesh ring 150 may be changed as appropriate according to the shape of the cup 110. Further, the number, size, arrangement, and the like of the openings 152 of the mesh ring 150 are appropriately determined according to the capacity to collect the resist liquid, the ability to exhaust the cup 110, the shape of the cup 110, and the like. A desirable shape of the openings 152 will be described later.

As illustrated in FIG. 2, a rail 160 extending along the Y direction (horizontal direction in FIG. 2) is formed on the X-direction negative side (down direction in FIG. 2) of the outer cup 120. For example, the rail 160 is formed from the outside of the outer cup 120 on the Y-direction negative side (leftward direction in FIG. 2) to the outside of the outer cup 120 on the Y-direction positive side (rightward direction in FIG. 2). The rail 160 is provided with two arms 161 and 162.

The first arm 161 supports a resist liquid supply nozzle 163 as a coating liquid supplier that supplies a resist liquid as a coating liquid. The resist liquid supplied by the resist liquid supply nozzle 163 has a high viscosity of, for example, 50 cp or more. The first arm 161 is movable on the rail 160 by a nozzle driver 164 as a moving mechanism. Thus, the resist liquid supply nozzle 163 may move from a standby part 165 provided outside the outer cup 120 on the Y-direction positive side to a standby part 166 provided outside the outer cup 120 on the Y-direction negative side by passing above a central portion of the wafer W within the outer cup 120. Further, the first arm 161 may be moved up and down by the nozzle driver 164, so that a height of the resist liquid supply nozzle 163 may be adjusted.

The second arm 162 supports a solvent supply nozzle 167 for supplying an organic solvent such as thinner onto the wafer W. The second arm 162 is movable on the rail 160 by a nozzle driver 169 as a moving mechanism. Thus, the solvent supply nozzle 167 may move from a standby part 168 provided outside the outer cup 120 on the Y-direction positive side to above the central portion of the wafer W within the outer cup 120. The standby part 168 is provided on the Y-direction positive side of the standby part 165. Further, the second arm 162 may be moved up and down by the nozzle driver 169, so that a height of the solvent supply nozzle 167 may be adjusted.

The solvent supplied from the solvent supply nozzle 167 functions as a pre-wet liquid supplied onto the wafer W during a pre-wet processing, which is performed before coating the resist liquid in order to facilitate the spreading of the resist liquid over the wafer W. Further, the solvent from the solvent supply nozzle 167 is shaken off from the wafer W during the pre-wet processing and drops onto the inner cup 130, and the dropped solvent flows down along the outer peripheral surface of the inner cup 130.

Further, as illustrated in FIG. 1, a back rinse liquid supply nozzle 170 for supplying an organic solvent such as thinner to a back side of the wafer W is provided between the inner cup 130 and the spin chuck 101. The solvent supplied from the back rinse liquid supply nozzle 170 is supplied to an end portion of the back side of the wafer W in order to prevent the resist liquid from flowing toward the back side of the wafer W, for example, when spreading the resist liquid over the wafer W. The solvent supplied to the back side of the wafer W drops into the inner cup 130 and flows down along the outer peripheral surface of the inner cup 130.

Figure 6:
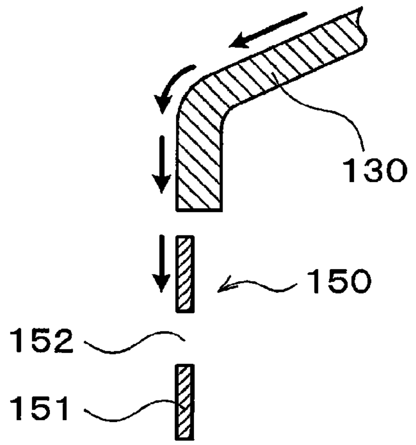
FIG. 6 is a view illustrating an example of flows of a solvent supplied to the mesh ring.

FIG. 6 is a view illustrating an example of a flow of the solvent supplied to the mesh ring 150. In FIG. 6, bold arrows schematically indicate a direction in which the solvent flows. As illustrated in FIG. 6, the solvent flowing down along the outer peripheral surface of the inner cup 130 flows along the sidewall 132 of the inner cup 130 and drops to the mesh ring 150. Thus, the solvent is supplied to the mesh ring 150.

In this way, since the solvent flowing down along the outer peripheral surface of the inner cup 130 is supplied to the mesh ring 150, a device for supplying the solvent to the outer peripheral surface of the inner cup 130 functions as a solvent supplier that supplies the solvent to the mesh ring 150.

In the present embodiment, the solvent supply nozzle 167 and the back rinse liquid supply nozzle 170 described above function as a solvent supplier. The solvent supplier is not limited to these nozzles 167 and 170, and may be, for example, a mechanism for discharging the solvent from a solvent discharge hole (not illustrated) provided inside the inner cup 130 to the outer peripheral surface of the inner cup 130. Also in this case, the solvent flowing down along the outer peripheral surface of the inner cup 130 is supplied to the mesh ring 150. That is, a configuration of the solvent supplier for supplying the solvent to the mesh ring 150 is not particularly limited.

As illustrated in FIG. 1, the resist coating apparatus 1 includes a controller 200. The controller 200 is, for example, a computer equipped with a CPU, a memory, and the like, and includes a program storage (not illustrated). Various programs for controlling a series of resist coating processes for the wafer W in the resist coating apparatus 1 are stored in the program storage. In addition, the programs were recorded on a computer-readable storage medium H, and may be installed from the storage medium H to the controller 200. The storage medium H may be a transitory storage medium or a non-transitory storage medium. A portion or all of the programs may be realized by dedicated hardware (circuit board).

The resist coating apparatus 1 according to the present embodiment is configured as described above. The resist coating apparatus 1 may collect the resist liquid flowing down along the outer peripheral surface of the inner cup 130 during a resist coating processing, or the resist liquid solidified in a filamentous form by the mesh ring 150 arranged below the sidewall 132 of the inner cup 130.

Further, the solvent, which is supplied to the wafer W at a timing before or after the resist coating processing, flows down along the outer peripheral surface of the inner cup 130, so that the solvent may be supplied to the mesh ring 150. The solvent supplied to the mesh ring 150 comes into contact with the collected resist liquid or a solidified substance of the resist liquid, thereby diluting the resist liquid or dissolving the solidified substance of the resist liquid. Thus, the resist liquid collected in the mesh ring 150 or the solidified substance of the resist liquid becomes easy to be discharged, which makes it easy to be discharged from the liquid discharge port 147. As a result, the clogging of the exhaust path such as the exhaust port 144 or the exhaust pipe 146 with foreign substances may be prevented.

The schematic configuration of the resist coating apparatus 1 has been described above. Next, another configuration example of the mesh ring 150 will be described.

(Liquid Receiver)

Figure 7:
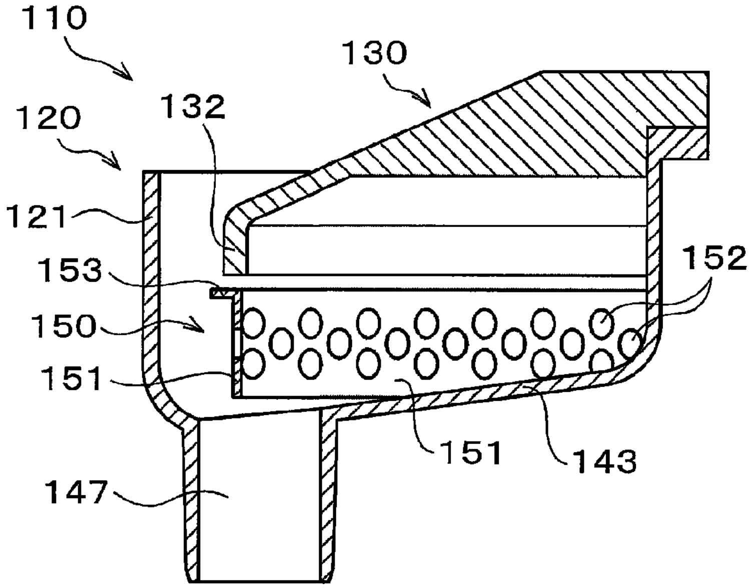
FIG. 7 is a longitudinal cross-sectional view of the cup for explaining a liquid receiver.
Figure 8:
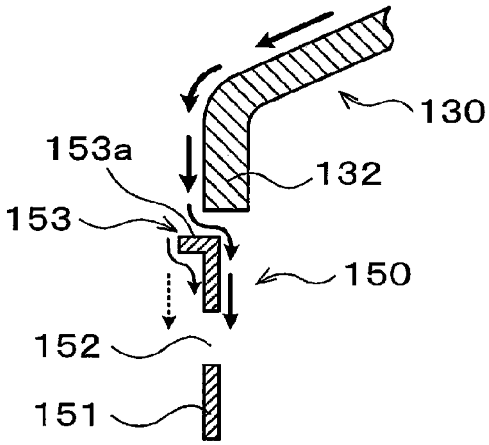
FIG. 8 is a view illustrating an example of flows of the solvent supplied to the mesh ring.

FIG. 7 is a longitudinal cross-sectional view of the cup 110 for explaining a liquid receiver 153. FIG. 8 is a view illustrating an example of flows of the solvent supplied to the mesh ring 150.

As illustrated in FIG. 7, the mesh ring 150 may include the liquid receiver 153 at the upper end portion of the sidewall 151. The liquid receiver 153 is a horizontal portion formed in a circular ring-shaped shape. An outer peripheral end of the liquid receiver 153 protrudes outward (toward the outer cup 120) from the outer peripheral surface of the sidewall 151. Further, the outer peripheral end of the liquid receiver 153 is located outward of the outer peripheral surface of the sidewall 132 of the inner cup 130.

In addition, the sidewall 151 and the liquid receiver 153 may be an integral body obtained by integral molding, or may be configured by assembling a plurality of components. The liquid receiver 153 does not have to be a horizontal shape, but may have a horizontal shape from the viewpoint of ease of processing, for example, when the sidewall 151 and the liquid receiver 153 are formed as one component by processing a metal plate such as stainless steel.

As illustrated in FIG. 8, when the liquid receiver 153 is provided, the solvent flowing down along the outer peripheral surface of the inner cup 130 drops from the lower end of the sidewall 132 onto the liquid receiver 153. Therefore, the liquid receiver 153 may receive and collect even the solvent which would not reach the sidewall 151 in the absence of the liquid receiver 153.

Then, the solvent dropped onto the liquid receiver 153 flows toward an inner peripheral end or an outer peripheral end of an upper surface of the liquid receiver 153 (liquid receiver surface 153*a*). The solvent directed to the inner peripheral end of the liquid receiver surface 153*a* is supplied to the inner peripheral surface of the sidewall 151 from the inner peripheral end. On the other hand, the solvent directed to the outer peripheral end of the liquid receiver surface 153*a* flows along a lower surface of the liquid receiver 153 and is supplied to the outer peripheral surface of the sidewall 151.

In this way, when the mesh ring 150 includes the liquid receiver 153, more of the solvent flowing down along the outer peripheral surface of the inner cup 130 may be collected, and may be supplied to the mesh ring 150. Therefore, the dilution of the resist liquid or the dissolution of the solidified substance of the resist liquid, collected in the mesh ring 150, is promoted, which makes it possible to enhance the effect of preventing the clogging of the exhaust path with foreign substances.

In addition, the shape of the liquid receiver 153 is not limited to the L-shape as illustrated in FIG. 8, and may be, for example, a T-shape. On the other hand, while the cup 110 is being exhausted, the exhaust flow is formed in a direction from an outer peripheral side to an inner peripheral side of the mesh ring 150 (direction from left to right in FIG. 8). Therefore, when the liquid receiver 153 has the T-shape, the solvent flowing along the inner peripheral end of the liquid receiver 153 may be affected by the exhaust flow and may have difficulty in reaching the sidewall 151.

Accordingly, as illustrated in FIG. 8, when the outer peripheral end of the liquid receiver 153 protrudes outward from the sidewall 132 of the inner cup 130, the inner peripheral end of the liquid receiver 153 and the inner peripheral surface of the sidewall 151 may be continuous without a step. This makes it easier to supply the solvent to the sidewall 151 from the inner peripheral end of the liquid receiver 153 compared to the T-shaped liquid receiver.

Further, the liquid receiver 153 may have, for example, any of shapes illustrated in FIGS. 9A to 9D.

Figure 9A:
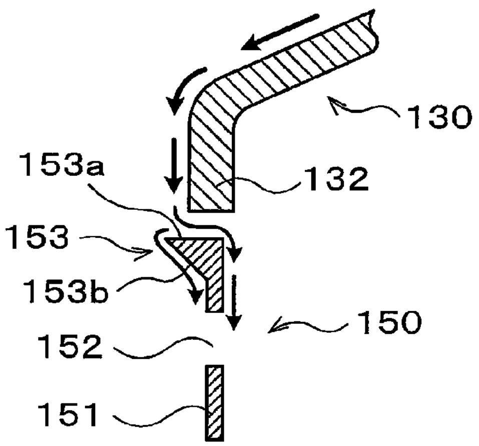
FIGS. 9A to 9D are views illustrating a configuration example of the liquid receiver.

FIG. 9A is an example in which the outer peripheral end of the liquid receiver 153 and the outer peripheral surface of the sidewall 151 are connected to each other by an inclined surface 153*b*. In the above-described liquid receiver 153 illustrated in FIG. 8, a portion of the solvent may drop from the outer peripheral end of the liquid receiver 153 as indicated by the dotted line arrow in FIG. 8, so that the solvent may not be supplied to the sidewall 151. On the other hand, according to the liquid receiver 153 having the inclined surface 153*b* illustrated in FIG. 9A, since the solvent flowing down from the outer peripheral end of the liquid receiver surface 153*a* is easy to flow along the inclined surface 153*b*, which may increase the amount of solvent supplied to the sidewall 151.

Figure 9B:
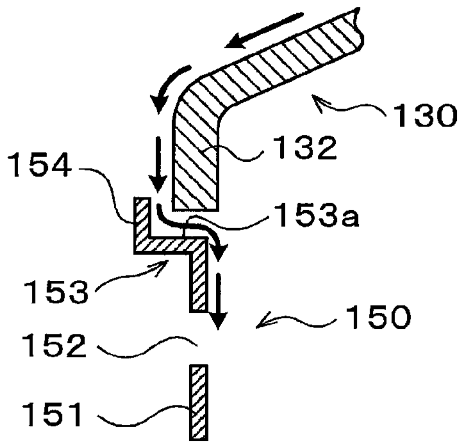

FIG. 9B is an example in which a sidewall 154 extending upward from the liquid receiver 153 is provided at the outer peripheral end of the liquid receiver 153. The sidewall 154 is a cylindrical wall, and the solvent flowing down along the outer peripheral surface of the inner cup 130 drops onto the liquid receiver surface 153*a* on an inner peripheral side of the sidewall 154. Then, the solvent dropped onto the liquid receiver surface 153*a* flows toward the inner peripheral end of the liquid receiver surface 153*a*, without dropping from the outer peripheral end of the liquid receiver surface 153*a*, due to the presence of the sidewall 154. That is, according to the liquid receiver 153 illustrated in FIG. 9B, the solvent, which would otherwise have dropped from the outer peripheral end of the liquid receiver surface 153*a*, may also be supplied to the sidewall 151.

Figure 9C:
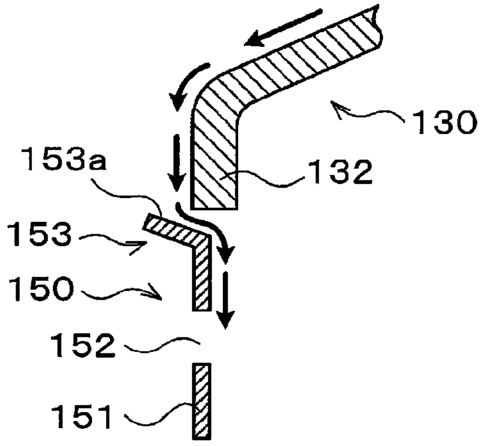

FIG. 9C is an example in which the outer peripheral end of the liquid receiver surface 153*a* is higher than the inner peripheral end thereof, and the liquid receiver surface 153*a* is inclined down from the outer peripheral end to the inner peripheral end. According to the liquid receiver 153 illustrated in FIG. 9C, the solvent dropped onto the liquid receiver surface 153*a* flows down toward the inner peripheral end of the liquid receiver surface 153*a* and becomes difficult to drop from the outer peripheral end of the liquid receiver surface 153*a*. Thus, the amount of solvent supplied from the liquid receiver surface 153*a* of the mesh ring 150 toward the inner peripheral surface of the sidewall 151 may be increased.

Figure 9D:
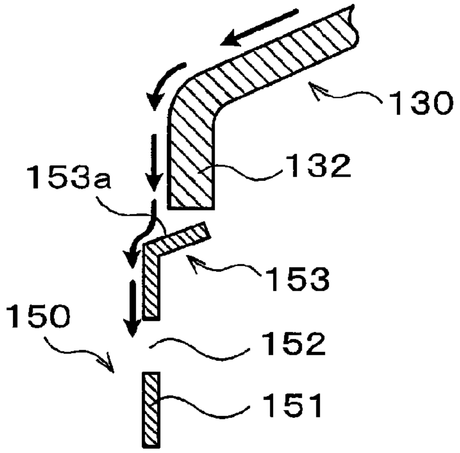

FIG. 9D is an example in which the outer peripheral end of the liquid receiver surface 153*a* is lower than the inner peripheral end thereof, and the liquid receiver surface 153*a* is inclined upward from the outer peripheral end to the inner peripheral end. According to the liquid receiver 153 illustrated in FIG. 9D, the solvent dropped onto the liquid receiver surface 153*a* flows down toward the outer peripheral end of the liquid receiver surface 153*a* and becomes difficult to drop from the inner peripheral end of the liquid receiver surface 153*a*. Thus, the amount of solvent supplied from the liquid receiver surface 153*a* of the mesh ring 150 toward the outer peripheral surface of the sidewall 151 may be increased.

Shape Example of Opening

Figure 10:
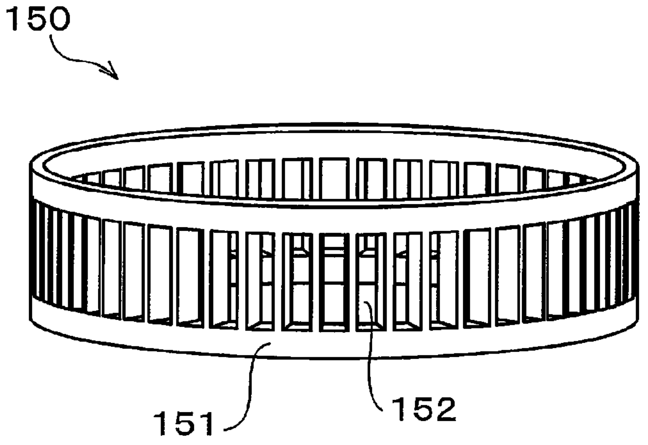
FIG. 10 is a perspective view of the mesh ring.

Next, other shape examples of the openings 152 will be described. FIG. 10 is a perspective view of the mesh ring 150.

The openings 152 illustrated in FIG. 10 have a rectangular shape, short sides of which are located at upper and lower ends of the opening 152. Further, the opening 152 extends from an upper end portion to a lower end portion of the sidewall 151 of the mesh ring 150. The respective openings 152 are arranged at intervals along the circumferential direction of the mesh ring 150.

When the openings 152 have such a shape, it is possible to prevent the openings 152 from being blocked by the solvent supplied to the mesh ring 150 and to make it easy to maintain a desired exhaust pressure upon the evacuation of the cup. The reason for this will be explained below with reference to FIGS. 11A to 11C.

Figure 11A:
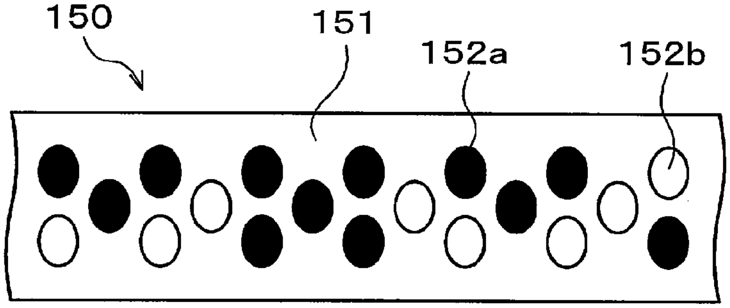
FIGS. 11A to 11C are views illustrating examples of states of the solvent remaining in openings.
Figure 11B:
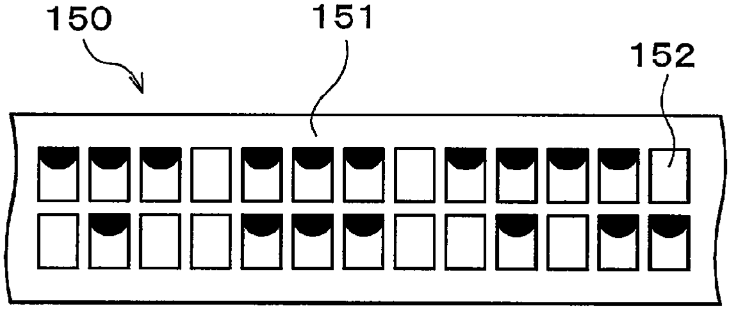
Figure 11C:
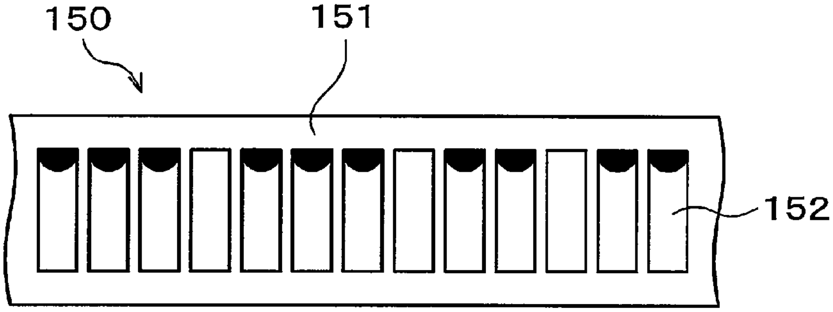

FIGS. 11A to 11C are views illustrating an example of states of the solvent remaining in the opening 152, and the black circles in the drawings schematically illustrate the solvent remaining in the openings 152.

The solvent supplied to the mesh ring 150 may remain adhered to the sidewall 151 or the openings 152 of the mesh ring 150 without being discharged. At this time, as illustrated in FIG. 11A, in a case where a shape of an upper end of the opening 152 is not horizontal such as an ellipse or a circle, a liquid film of the solvent is likely to be formed in the opening 152 when the solvent flowing down from top to bottom of the sidewall 151 passes through the opening 152.

Even if there is an opening 152*a* blocked by the liquid film, there is also an opening 152*b* that is open without the liquid film being formed. Thus, the resist coating process described above can be performed. However, the number of openings 152*b* through which the exhaust flow may pass is relatively reduced when the blocked opening 152*a* exists, so that it is difficult to maintain a desired exhaust pressure upon the evacuation of the cup. Therefore, in order to perform the resist coating process while maintaining the exhaust capacity of the cup within an allowable range, it is necessary to increase the frequency of maintenance for removing the liquid film from the blocked opening 152*a*.

On the other hand, as illustrated in FIG. 11B, when the shape of the upper end of the opening 152 is horizontal, a liquid film that blocks the opening 152 is less likely to be formed. Therefore, the upper end of the opening 152 may be formed horizontally.

Further, the opening 152 may have a rectangular shape, and short sides thereof may be located at the upper and lower ends of the opening 152, as illustrated in FIG. 11B. Thus, formation of the liquid film by the solvent supplied to the mesh ring 150 may be further prevented.

On the other hand, when a plurality of rectangular openings 152 are arranged in the height direction of the mesh ring 150 as illustrated in FIG. 11B, there are cases where solvent droplets are formed in the respective openings 152 arranged in the height direction.

Therefore, the rectangular opening 152 may extend from the upper end portion to the lower end portion of the sidewall 151 of the mesh ring 150, as illustrated in FIG. 11C in addition to FIG. 10 described above. Thus, the number of openings 152 arranged in the height direction is reduced, and locations where the solvent droplets are likely to occur are also reduced. As a result, even if the solvent droplets are formed in the openings 152, a reduction in the opening area of the mesh ring 150 as a whole may be prevented. Therefore, a desired exhaust pressure may be easily maintained even if the frequency of maintenance of the mesh ring 150 is reduced.

(Fixing of Mesh Ring)

Next, an example of a method of fixing the mesh ring 150 will be described.

Figure 12:
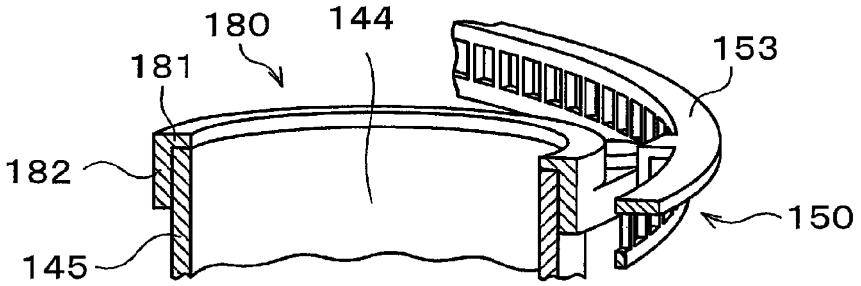
FIG. 12 is an explanatory view for explaining an example of a fixing structure of the mesh ring.
Figure 13:
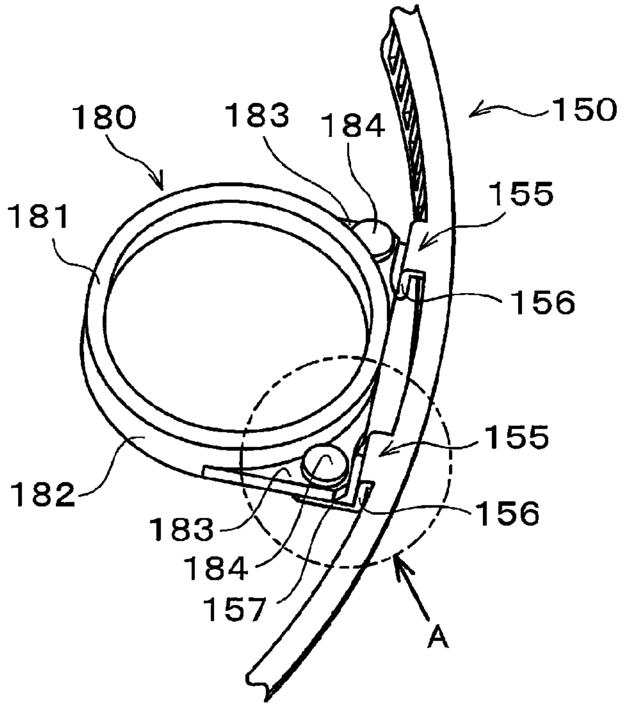
FIG. 13 is an explanatory view for explaining the mesh ring and a mounting portion of an attachment member.
Figure 14:
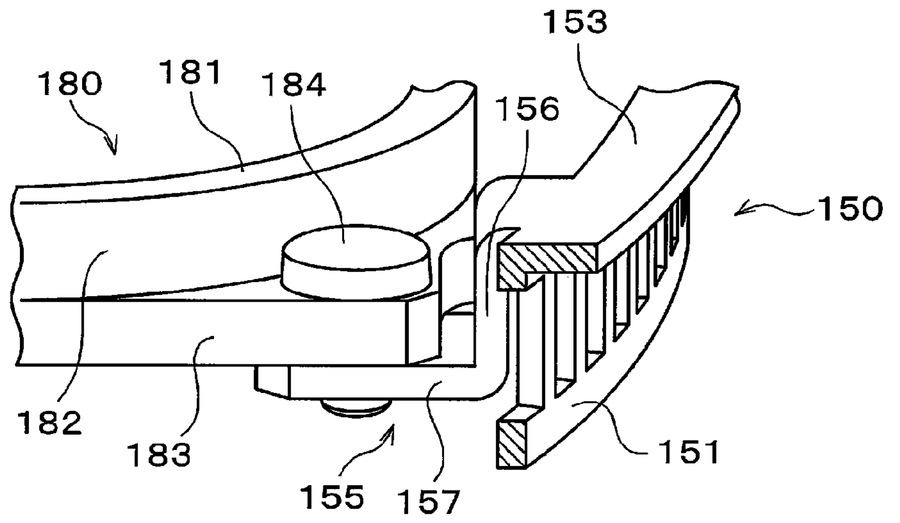
FIG. 14 is an enlarged view of portion A of FIG. 13.
Figure 15:
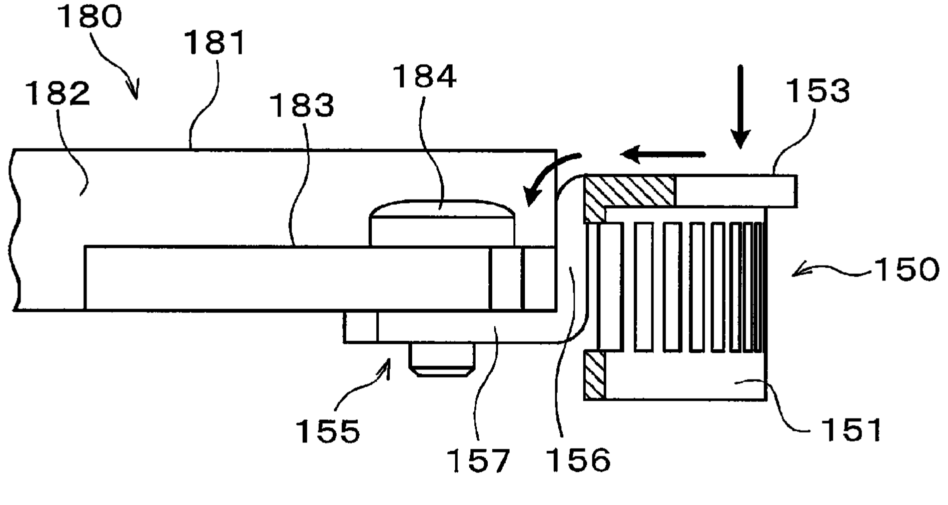
FIG. 15 is a view illustrating an example of flows of the solvent supplied to the mesh ring.

FIG. 12 is an explanatory view for explaining a fixing structure of the mesh ring 150, in which a partial cross section of the fixing structure is illustrated. FIG. 13 is an explanatory view for explaining the mesh ring 150 and a mounting portion of an attachment member 180. FIG. 14 is an enlarged view of portion A of FIG. 13. FIG. 15 is a view illustrating an example of flows of the solvent supplied to the mesh ring 150, in which bold arrows schematically indicate a direction in which the solvent flows.

In the example illustrated in FIG. 12, the mesh ring 150 is fixed to the cylindrical wall portion 145 via the attachment member 180. The attachment member 180 has a circular ring-shaped upper surface portion 181 and a sidewall portion 182 extending downward from an outer peripheral end of the upper surface portion 181. A material of the attachment member 180 is, for example, a metal such as stainless steel, but is not particularly limited as long as it has chemical resistance to solvents.

When attaching the attachment member 180 to the cylindrical wall portion 145, an upper end of the cylindrical wall portion 145 is covered with the attachment member 180, so that the upper surface portion 181 comes into contact with an upper surface of the cylindrical wall portion 145, and an inner peripheral surface of the sidewall portion 182 comes into contact with an outer peripheral surface of the cylindrical wall portion 145. In other words, the attachment member 180 has a shape in which it is fitted to the upper end of the cylindrical wall portion 145, and is configured to be detachable with respect to the upper end of the cylindrical wall portion 145.

As illustrated in FIGS. 13 and 14, the sidewall portion 182 is provided with a mounting portion 183 protruding outward from an outer peripheral surface of the sidewall portion 182 to attach the mesh ring 150 thereto. The mounting portion 183 is provided at a lower end of the sidewall portion 182, so that an upper surface of the mounting portion 183 is positioned lower than an upper end of the sidewall portion 182. Further, two mounting portions 183 are formed at an interval along the circumferential direction of the sidewall portion 182.

An inner peripheral surface of the mesh ring 150 is provided with bracket portions 155 as mounting portions for the attachment of the attachment member 180, which are formed at the same interval as the two mounting portions 183 described above. The bracket portion 155 has a wall 156 extending downward from the inner peripheral surface of the upper end portion of the sidewall 151, and a horizontal wall 157 protruding inward from a lower end portion of the wall 156. That is, the bracket portion 155 has an L-shape defined by the walls 156 and 157.

When attaching the attachment member 180 to the mesh ring 150, the mounting portion 183 of the attachment member 180 is superimposed on the wall 157 of the bracket portion 155, and both components are fixed to each other by a bolt 184 as a fastener. Then, the upper end of the cylindrical wall portion 145 (FIG. 12) is covered with the attachment member 180 having the mesh ring 150 attached thereto, so that the mesh ring 150 is fixed to the cylindrical wall portion 145.

If the mesh ring 150 is fixed to the cylindrical wall portion 145 as described above, the mesh ring 150 may be provided not only when the resist coating apparatus 1 is newly manufactured, but also for an existing resist coating apparatus having no mesh ring 150.

Further, in a case where the mesh ring 150 is detachably fixed to the cylindrical wall portion 145, maintenance of the mesh ring 150 such as replacement or cleaning may be performed easily. In addition to this, the mesh ring 150 may be compatibly used in a plurality of resist coating apparatuses.

Further, in the method of fixing the mesh ring 150 described above, the solvent dropped to the liquid receiver 153 flows on the sidewall 151, but at a location where the bracket portion 155 is formed, as illustrated in FIG. 15, the solvent flows from the liquid receiver 153 to the bracket portion 155. Then, the solvent that has flown on the bracket portion 155 flows along the walls 156 and 157, drops from the wall 157, and is discharged. That is, since the mounting portion between the mesh ring 150 and the attachment member 180 is positioned lower than an upper end of the attachment member 180, the solvent which has flown from the mesh ring 150 toward the attachment member 180 may be prevented from flowing into the exhaust port 144 (FIG. 12).

In the above, the method of fixing the mesh ring 150 to the cylindrical wall portion 145 via the attachment member 180 has been described.

In addition, the mesh ring 150 may be fixed so as not to come into contact with the cup 110 except for a fixing portion between the mesh ring 150 and the cylindrical wall portion 145 (the attachment member 180 in the example of FIG. 12). Thus, the resist liquid is prevented from staying between the mesh ring 150 and the cup 110, which makes it possible to prevent sticking of components due to solidification of the resist liquid.

In particular, when the mesh ring 150 is not in contact with the bottom member 143 of the cup 110 (FIG. 1), the resist liquid diluted with the solvent or a solution of the filamentous or flocculent foreign substances dissolved by the solvent is easy to be discharged.

In addition, the mesh ring 150 and the cylindrical wall portion 145 may be fixed without providing the attachment member 180. In this case, the fixing portion (not illustrated) between the mesh ring 150 and the cylindrical wall portion 145 may be positioned lower than the upper end of the cylindrical wall portion 145. Thus, the solvent flowing to the fixing portion between the mesh ring 150 and the cylindrical wall portion 145 is easy to be discharged without overflowing the upper end of the cylindrical wall portion 145, which prevents the solvent from flowing into the exhaust port 144.

The liquid processing apparatus according to the present disclosure has been described above by taking the resist coating apparatus 1 as an example. In addition, the liquid processing apparatus according to the present disclosure may also be applied to liquid processing apparatuses for processing target substrates other than semiconductor wafers, such as flat panel display (FPD) substrates and mask reticles for photomasks.

According to the present disclosure in some embodiments, it is possible to prevent clogging of an exhaust path by foreign substances generated during a spin coating process of a substrate.

The embodiments disclosed herein should be considered to be exemplary and not limitative in all respects. The above embodiments may be omitted, replaced, or modified in various forms without departing from the scope of the appended claims, configuration examples within the technical scope of the present disclosure, and the gist thereof. For example, the constituent elements of the above embodiments may be arbitrarily combined. From this arbitrary combination, actions and effects related to each element of the combination are naturally obtained, and other actions and effects that are clear to those skilled in the art from the description in this specification are obtained.

Further, the effects described herein are merely illustrative or exemplary and not limiting.

In other words, the technology of the present disclosure may produce other effects that are clear to those skilled in the art from the description of this specification in addition to or instead of the above effects.

In addition, the following configuration examples also belong to the technical scope of the present disclosure.

(1) A liquid processing apparatus that applies a coating liquid onto a substrate, includes: a substrate holder configured to hold and rotate the substrate; a coating liquid supplier configured to supply the coating liquid to the substrate held by the substrate holder; a cup provided to surround the substrate held by the substrate holder; and a solvent supplier configured to supply a solvent for the coating liquid to a coating liquid collector, wherein the cup includes: an outer cup arranged outside the substrate holder; an inner cup arranged on an inner peripheral side of the outer cup below the substrate holder and having a downwardly-extending wall; an exhaust path provided between the outer cup and the inner cup; and the coating liquid collector provided with a plurality of openings through which an exhaust flow passes, the coating liquid collector extending downward below the downwardly-extending wall of the inner cup with a gap between the coating liquid collector and a lower end of the downwardly-extending wall.

(2) In the liquid processing apparatus of (1) above, the coating liquid collector includes a liquid receiver at an upper end portion of the coating liquid collector to receive the solvent dropping from the downwardly-extending wall.

(3) In the liquid processing apparatus of (2) above, the liquid receiver protrudes outward from an outer peripheral surface of the downwardly-extending wall.

(4) In the liquid processing apparatus of (2) or (3) above, the liquid receiver has a horizontal shape.

(5) In the liquid processing apparatus of any one of (1) to (4) above, an upper end of each of the plurality of openings has a horizontal shape.

(6) In the liquid processing apparatus of any one of (1) to (5) above, each of the plurality of openings has a rectangular shape, and short sides of the rectangular shape are located at upper and lower ends of each of the plurality of openings.

(7) In the liquid processing apparatus of any one of (1) to (6) above, the plurality of openings extend from an upper end portion to a lower end portion of the coating liquid collector, and the plurality of openings are arranged at an interval along a circumferential direction of the coating liquid collector.

(8) In the liquid processing apparatus of any one of (1) to (7) above, further comprising: a cylindrical wall portion provided below the inner cup and having an exhaust port communicating with the exhaust path, wherein the coating liquid collector is fixed to the cylindrical wall portion.

(9) In the liquid processing apparatus of (8) above, the coating liquid collector is not in contact with the cup except for a fixing portion between the coating liquid collector and the cylindrical wall portion.

What is claimed is:

1. A liquid processing apparatus that applies a coating liquid onto a substrate, comprising:

a substrate holder configured to hold and rotate the substrate;

a coating liquid supplier configured to supply the coating liquid to the substrate held by the substrate holder;

a cup provided to surround the substrate held by the substrate holder; and a solvent supplier configured to supply a solvent for the coating liquid to a coating liquid collector, wherein the cup includes:

an outer cup arranged outside the substrate holder;

an inner cup arranged on an inner peripheral side of the outer cup below the substrate holder and having a downwardly-extending wall;

an exhaust path provided between the outer cup and the inner cup; and the coating liquid collector provided with a plurality of openings through which an exhaust flow passes, the coating liquid collector extending downward below the downwardly-extending wall of the inner cup with a gap between the coating liquid collector and a lower end of the downwardly-extending wall.

2. The liquid processing apparatus of claim 1, wherein the coating liquid collector includes a liquid receiver at an upper end portion of the coating liquid collector to receive the solvent dropping from the downwardly-extending wall.

3. The liquid processing apparatus of claim 2, wherein the liquid receiver protrudes outward from an outer peripheral surface of the downwardly-extending wall.

4. The liquid processing apparatus of claim 3, wherein the liquid receiver extends horizontally.

5. The liquid processing apparatus of claim 4, wherein an upper end of each of the plurality of openings extends horizontally.

6. The liquid processing apparatus of claim 4, wherein each of the plurality of openings has a rectangular shape, and short sides of the rectangular shape are located at upper and lower ends of each of the plurality of openings.

7. The liquid processing apparatus of claim 6, wherein the plurality of openings extend from an upper end portion to a lower end portion of the coating liquid collector, and wherein the plurality of openings are arranged at an interval along a circumferential direction of the coating liquid collector.

8. The liquid processing apparatus of claim 4, further comprising: a cylindrical wall portion provided below the inner cup and having an exhaust port communicating with the exhaust path, wherein the coating liquid collector is fixed to the cylindrical wall portion.

9. The liquid processing apparatus of claim 8, wherein the coating liquid collector is not in contact with the cup except for a fixing portion between the coating liquid collector and the cylindrical wall portion.

10. The liquid processing apparatus of claim 1, wherein an upper end of each of the plurality of openings extends horizontally.

11. The liquid processing apparatus of claim 1, wherein each of the plurality of openings has a rectangular shape, and short sides of the rectangular shape are located at upper and lower ends of each of the plurality of openings.

12. The liquid processing apparatus of claim 1, further comprising: a cylindrical wall portion provided below the inner cup and having an exhaust port communicating with the exhaust path, wherein the coating liquid collector is fixed to the cylindrical wall portion.

* * * * *